United States Patent [19]

Ohigashi et al.

[11] Patent Number: 5,679,753
[45] Date of Patent: Oct. 21, 1997

[54] FERROELECTRIC POLYMER SINGLE CRYSTALLINE BODY AND METHOD OF PRODUCING THE SAME AND USE THEREOF

[75] Inventors: Hiroji Ohigashi; Kenji Omote, both of Yonezawa; Teruhisa Gomyo, Nagano, all of Japan

[73] Assignee: Yamagata University, Yamagata, Japan

[21] Appl. No.: 502,322

[22] Filed: Jul. 13, 1995

[30] Foreign Application Priority Data

Jul. 26, 1994 [JP] Japan .................. 6-173921

[51] Int. Cl.$^6$ .................. C08F 14/22; C08F 14/26; C08J 5/18
[52] U.S. Cl. .................. 526/255; 528/502; 528/503; 526/250
[58] Field of Search .................. 526/255; 428/421, 428/394; 528/502, 503

[56] References Cited

U.S. PATENT DOCUMENTS

| | | | |
|---|---|---|---|
| 4,173,033 | 10/1979 | Sako et al. | 526/255 X |
| 4,268,653 | 5/1981 | Uchidoi et al. | 526/255 |
| 4,577,132 | 3/1986 | Ohigashi et al. | 526/255 X |
| 4,778,867 | 10/1988 | Preis | 526/255 |

*Primary Examiner*—Tae Yoon
*Attorney, Agent, or Firm*—Spencer & Frank

[57] ABSTRACT

A ferroelectric polymer single crystalline body consists of a copolymer of ethylene trifluoride and/or ethylene tetrafluoride and vinylidene fluoride in form of a film or a fiber and is used in a piezoelectric, pyroelectric or nonlinear optical element. The single crystalline body is produced by crystallizing a stretched film of the single crystalline body at hexagonal phase while maintaining the stretched film surface at a free state.

16 Claims, 2 Drawing Sheets

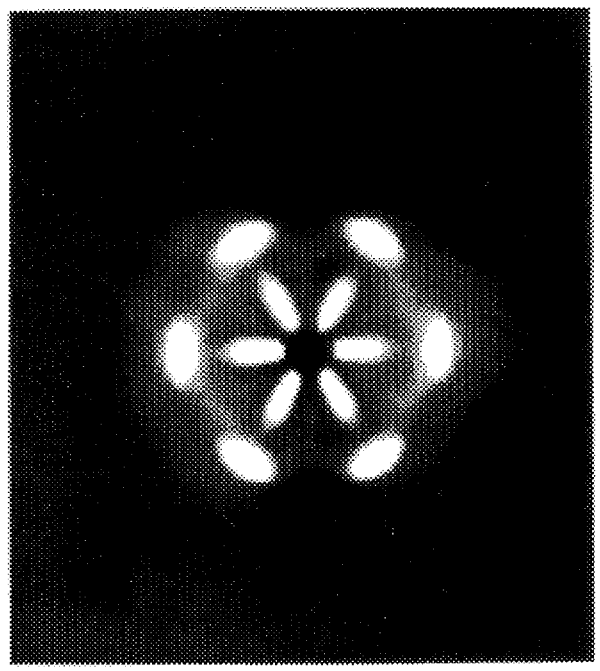
FIG_2

FERROELECTRIC POLYMER SINGLE CRYSTALLINE BODY AND METHOD OF PRODUCING THE SAME AND USE THEREOF

BACKGROUND OF THE INVENTION

1. Field of the Invention

This invention relates to a ferroelectric polymer material having a strong piezoelectricity and a mechanical toughness in the form of single crystalline film or fiber and a method of producing the same and use in piezoelectric, pyroelectric or nonlinear optical elements.

2. Description of the Related Art

It is well-known that polyvinylidene fluoride (PVDF), copolymer [P(VDF-TrFE)] of vinylidene fluoride (VDF) and ethylene trifluoride (TrFE), and copolymer [P(VDF-TeFE)] of vinylidene fluoride and ethylene tetrafluoride (TeFE) exhibit strong piezoelectricity through poling treatment. These polymers are used in signal and energy converting elements of electrical systems and mechanical systems including an ultrasonic transducer as a piezoelectric material, or in heat and radiation detecting elements as a pyroelectric material. Particularly, when vinylidene fluoride-ethylene trifluoride copolymers P(VDF-TrFE) having an adequate mol ratio range of vinylidene fluoride (VDF) to ethylene trifluoride (TrFE) are crystallized by a heat treatment within a particular temperature range, they are the materials having the greatest electromechanical conversion efficiency among the existing known piezoelectric polymer materials. That is, the vinylidene fluoride-ethylene trifluoride copolymers P(VDF-TrFE) containing about 60–90 mol % of vinylidene fluoride (VDF) are crystallized by a heat treatment at a paraelectric phase (hexagonal phase) and subjected to a poling to provide high-performance piezoelectric and pyroelectric materials.

As to these materials, the followings are known from various studies by Ohigashi et al (H. Ohigashi and K. Koga, Jpn. J. Appl. Phys., 21(1982), L455–L457; K. Koga and H. Ohigashi, J. Appl. Phys., 56(1986), 2142–2150; H. Ohigashi and T. Hattori, Jpn. J. Appl. Phys., 28(1989), L1612–L1615; K. Koga, N. Nakano and H. Ohigashi, J. Appl. Phys., 67(1990), 965–974 and the like) up to the present. That is, the vinylidene fluoride-ethylene trifluoride copolymers P(VDF-TrFE) having the above composition are orthorhombic crystals at room temperature. However, a stable paraelectric phase (hexagonal phase) appears at a higher temperature when the content of vinylidene fluoride (VDF) is not more than about 82 mol %, while when the VDF content is more than 82 mol % but not more than about 90 mol %, a metastable paraelectric phase appears at a higher temperature except for a special case. In the paraelectric phase, a lamellar crystal of 0.1–1 μm in thickness having properties as an extended chain crystal considerably grows to attain a film crystallinity of not less than 90%. Furthermore, columnar or plate-shaped single crystals having a size of a few μm are developed on the lamellar crystal as a substrate though the number of these crystals is few. The piezoelectricity of the copolymer is created when the molecular dipole is cooperatively (ferroelectrically) oriented in a direction nearest to the direction of an electric field among directions obtainable in the crystal if there exists an electric field which is larger than the coercive field. Therefore, it is considered that strong piezoelectricity results from the growth of thick lamellar crystal.

As a heat treatment for the growth of the lamellar crystal, there has hitherto been used a method wherein isothermic crystallization is carried out by dropping down the copolymer from a molten state or raising the copolymer from the orthorhombic phase into the hexagonal phase in a state in which a stretched or unstretched film is closely contacted with a glass plate or a metal plate or the film is sandwiched between flat plates or curved rigid bodies. Such a heat treatment is effective to promote the growth of the lamellar crystal and to avoid the deformation of the film because the paraelectric phase is in a liquid crystal state and the film becomes considerably flexible.

However, the well grown film of the lamellar crystals has some drawbacks as mentioned below. Since the lamellar crystal is grown in a lamination state, the resulting film becomes brittle and is easily broken by bending or tensile stress (i.e. the lamellar crystals are separated by a small stress because a high polymer chain is not existence between the lamellar crystals). Furthermore, the lamellar crystal does not develop in a certain direction in the film during the growth of the lamellar crystal, so that the orientation distribution of the molecular chain axis is considerably degraded from an ideal state. Moreover, the film becomes opaque owing to the presence of the lamellar crystal, so that it can not be put into practical use even though there exists a secondary nonlinear optical effect.

SUMMARY OF THE INVENTION

It is, therefore, an object of the invention to provide a transparent film or fiber of a copolymer [P(VDF-TrFE)] of vinylidene fluoride and ethylene trifluoride or a copolymer [P(VDF-TeFE)] of vinylidene fluoride and ethylene tetrafluoride having mechanical toughness and high piezoelectricity and pyroelectricity. In other words, the invention is to provide a film or fiber of the copolymer having a highly developed orientation of molecular chains without the growth of a thick lamellar crystal as is necessarily produced in the conventional crystallization method, or ideally having the form of a single crystalline film or fiber thereof. It is another object of the invention to provide elements utilizing the piezoelectricity, pyroelectricity and optical nonlinearity of the single crystalline film or fiber.

According to a first aspect of the invention, a ferroelectric polymer single crystalline body consisting of a copolymer of ethylene trifluoride and/or ethylene tetrafluoride and vinylidene fluoride in a form of a film or a fiber is provided.

According to a second aspect of the invention, a method of producing a ferroelectric polymer single crystalline body is provided, which comprises stretching a ferroelectric polymer film or fiber consisting of a copolymer of ethylene trifluoride and/or ethylene tetrafluoride and vinylidene fluoride and crystallizing at a paraelectric phase or a hexagonal phase thereof, in which the crystallization is promoted while maintaining a stretched surface of the film or fiber at a substantially free state.

According to a third aspect of the invention, use of a ferroelectric polymer single crystalline body in a piezoelectric, pyroelectric or nonlinear optical element is provided, said single crystalline body consisting of a copolymer of ethylene trifluoride and/or ethylene tetrafluoride and vinylidene fluoride in a form of a film or a fiber which has been subjected to a poling.

The ferroelectric polymer single crystalline bodies according to the invention can generally be used as a piezoelectric or pyroelectric material after the poling. That is, they can be used as an electromechanical converting element having a high conversion efficiency, such as piezoelectric sensors, actuators and audio and ultrasonic transducers, over a frequency range of from zero to high frequency (GHz) within a temperature range of from a cryogenic temperature (mK) to the Curie temperature or melting point (for example, the melting point is lower than the Curie point in P(VDF-TrFE) containing not less than 82 mol % of VDF). In this case, the above single crystalline body may include shearing deformation or stress in addition to stretching or compression as mechanical deformation or stress (e.g., matrix components in piezoelectric constant e of the single crystalline body are $e_{31}$, $e_{32}$, $e_{33}$, $e_{15}$ and $e_{24}$ when selecting the 1-axis in the stretching direction and the 3-axis in the polarization direction, and all of them have industrially utilizable values). Furthermore, they can be used as a pyroelectric element within the above temperature range. Moreover, they can be used as a secondary nonlinear optical element such as light modulating element or second harmonic generation element.

BRIEF DESCRIPTION OF THE DRAWINGS

The invention will be described with reference to the accompanying drawings, wherein:

FIG. 2 is an X-ray diffraction pattern of a single crystalline film of Example 1 when an incidence of the X-ray is in parallel to a stretching direction of the film.

DESCRIPTION OF THE PREFERRED EMBODIMENTS

Figure 1:
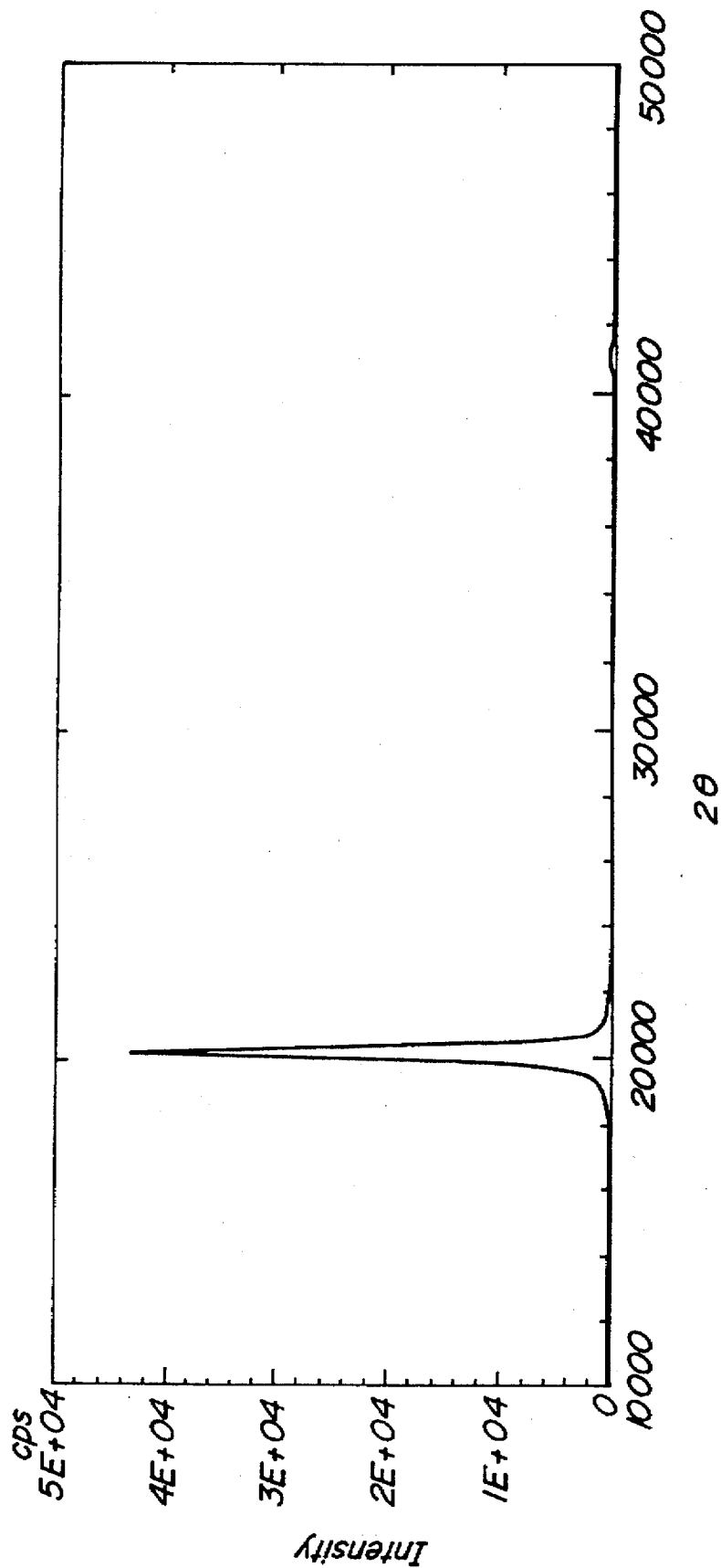
FIG. 1 is a graph showing the relationship between intensity and 2 θ in X-ray diffraction of a single crystalline film of Example 1 as measured by a symmetrical reflection process.

Heretofore, it has been considered that a crystal grown at the hexagonal phase (paraelectric phase) is a thick lamellar crystal having properties near to the extended chain crystal. In this connection, the inventors have made studies with respect to the crystallization course at this phase and confirmed that the hexagonal phase is not a satisfactory condition for growing the thick lamellar crystal and it is necessary to apply a mechanical restraint or stress to the film when the crystallization is conducted by raising the temperature from the orthorhombic phase to the hexagonal phase. That is, when the stretched film is crystallized at the hexagonal phase, the film is fixed to a support substrate or sandwiched between fastening plates and then heat-treated to attain the growth of the thick lamellar crystal in the film. Alternatively, the growth of the lamellar crystal is attained even if the crystallization is conducted by cooling from a molten state to the hexagonal phase. This is considered to be due to the fact that shearing stress or shearing strain produced by thermal contraction or expansion of the film is applied to a group of molecular chains which are in a liquid crystal state at a temperature above a temperature region near to a transition point from the orthorhombic phase to the hexagonal phase (Curie point) to grow the lamellar crystal.

Now, the inventors have made further studies with respect to the crystallization condition for obtaining a well double-oriented film of a copolymer [P(VDF-TrFE)] of vinylidene fluoride and ethylene trifluoride without the growth of lamellar crystal and found out the following point which is very important scientifically and technologically. That is, it has been found that a highly biaxial stretched film is obtained by crystallizing a double-oriented film of the copolymer P(VDF-TrFE) at the hexagonal phase (paraelectric phase) while maintaining a free surface without the fixation of the surface. Furthermore, it has been confirmed that the resulting double-oriented film is a single crystal as a result of analyzing the structure of the film through X-ray diffraction, electron ray diffraction and a polarization microscope. In the film before the poling, the c-axis of the crystal (crystallographic axis [001] in a direction of the molecular chain) is parallel with the stretching axis and the direction of crystallographic axis [100] or [110] meets with a normal direction of the film surface, while the direction of crystallographic axis [110] in the film after the poling meets with the normal direction. Moreover, there is a possibility that a ferroelectric domain exists in the single crystal as mentioned in the following Example 1 and there may be distribution of molecular chain distance in the single crystal. In the invention, therefore, the single crystal includes a crystal having a domain structure or a crystal having a disturbed arrangement of twin and molecular chain.

According to the invention, it is possible to produce a fibrous single crystal. That is, a fibrous single crystal having a c-axis parallel to an axis of the fiber can be obtained by promoting the crystallization of a uniaxially stretched fiber of the copolymer P(VDF-TrFE) at the hexagonal phase while maintaining the side surface of the fiber at a free state.

In the invention, the crystallization of the film or fiber with holding at the free surface state means that the crystallization at the hexagonal phase takes place without sandwiching the film or fiber between fastening plates and at a state in which shearing stress or excessive compression stress is not applied to the surface of the film or fiber from exterior. Ideally, the crystallization is carried out under vacuum, or in a gas or a liquid. However, the crystallization may be carried out by placing the film or fiber of the copolymer P(VDF-TrFE) at paraelectric phase on a tack-free material, such as polyethylene tetrafluoride (Teflon, trade name) or the like. In the latter case, both ends of the film in the c-axis direction may be fixed or may not be fixed, but it is favorable that both ends of the film are fixed or a certain tension is applied to the film in order to obtain a non-bent uniform film. Furthermore, in order to obtain an undisturbed single crystal, it is preferable that the stretched film is preliminarily subjected to a heat treatment at a temperature lower than the transition point from the orthorhombic phase to the hexagonal phase prior to the crystallization at the hexagonal phase.

Although the mechanism of forming the single crystal according to the invention is not yet clear, the following have been elucidated up to the present. That is, the polymer film according to the invention at the state of the hexagonal phase possesses liquid properties in the direction of the molecular chain and solid properties in the direction perpendicular to the molecular chain, so that the molecular chain can easily move in the stretching direction but the perpendicular movement is difficult since shearing stress is not applied to the molecular chain from the exterior. On the other hand, the perpendicular movement of the molecular chain is required for the growth of the lamellar crystal and, also, the surface energy of the lamellar crystal becomes high owing to the folding of the molecule. In the uniaxially oriented molecular chain aggregate having a free surface not having an applied shearing strain, therefore, it is considered that a system of forming the single crystalline film by sliding in the direction of the molecular chain a slight movement the perpendicular direction becomes lower in free energy than a system of forming the lamellar crystal at the hexagonal phase. In the single crystalline film, it is considered that the arrangement of making the zigzag plane of the molecular chain parallel to the film surface is lowest in energy at the free surface and a single crystalline film having a (100) plane parallel to the film surface is formed by crystallizing the molecular chains in the film surface under the condition of such an arrangement.

As the copolymer capable of forming the single crystalline film according to the method of the invention, there are a copolymer P(VDF-TrFE) of vinylidene fluoride and ethylene trifluoride (preferably containing about 60–90 mol % of vinylidene fluoride) and a copolymer P(VDF-TeFE) of vinylidene fluoride and ethylene tetrafluoride (preferably containing 70–90 mol % of vinylidene fluoride). Furthermore, a terpolymer of vinylidene fluoride, ethylene trifluoride and ethylene tetrafluoride exhibiting a hexagonal phase at a high temperature may be used. Even if a copolymer has a composition not developing the hexagonal phase at atmospheric pressure among the above copolymers, the hexagonal phase appears at a higher pressure, so that the method according to the invention is applicable to a copolymer P(VDF-TrFE) containing not less than 90 mol % of polyvinylidene fluoride (PVDF) and a stretched film of PVDF in the crystallization under a high pressure.

The single crystal according to the invention is generally poled by the conventionally known method. For example, static voltage or alternating voltage is applied to the single crystalline film after electrodes are deposited onto the film or contacted with the film. Furthermore, the poling may be carried out by corona discharge. A hysteresis curve between electric displacement (D) and field intensity (E) in the single crystalline film indicates more conspicuous characteristics of the ferroelectric crystal as compared with that of the lamellar crystal film because the polarization reversal at coercive field is more steep.

The following examples are given in illustration of the invention and are not intended as limitations thereof.

EXAMPLE 1

A film of a copolymer P(VDF-TrFE) of vinylidene fluoride (VDF) and ethylene trifluoride (TrFE) formed in dimethylformamide as a solvent having a molar fraction of VDF/TrFE of 75/25 and a molecular weight of about 200,000 is uniaxially stretched about 5 times at room temperature. The uniaxial stretched film has a Curie point of 123° C. and a melting point of 150° C. After both ends of the stretched film (thickness: 70 μm) are fixed in a direction perpendicular to the stretching direction, the temperature is raised at a heating rate of about 5° C./min from room temperature to 140° C., the film is crystallized at this temperature (hexagonal phase) in air for 2 hours and then slowly cooled to room temperature.

The thus obtained crystallized film is transparent and apparently uniform. Furthermore, this film has a homogeneous structure without a lamellar crystal as a result of observation by means of a polarization microscope, in which the orientation is uniform over the whole of the film. According to X-ray diffraction, a strong reflection (d=4.40 Å) from the (110) plane or (200) plane is observed in the film as shown in FIG. 1. Since reflection of the (400) plane or the (220) plane is weak, disorder in the lattice spacing inherent to the copolymer itself exists, but the presence of an amorphous portion is not observed. When incident X-ray is parallel to the stretching axis, 6 strong diffraction points are observed in a diffraction pattern as shown in FIG. 2, from which it is clear that the (110) plane or the (200) plane is parallel to the film surface over the full region of the film. Moreover, there is a large possibility that both faces form a ferroelectric domain structure at an unpiling state. After the poling, the (110) plane is parallel to the film surface.

From the above results, it is apparent that the film may be a single crystal as a whole. Moreover, even if the crystallization is carried out at 130° C., the resulting film is a single crystal. Even when a stretched film having a thickness of 8 μm is crystallized, a single crystal is obtained.

FIG. 1 shows the relation between intensity and 2 θ in the X-ray diffraction of the single crystalline film obtained in Example 1 as measured by the symmetrical reflection process. In this case, θ is an angle between the film surface and an incident (or reflective) X-ray. The stretching axis or c-axis of the crystal is perpendicular to incident and reflective faces of X-ray.

FIG. 2 is an X-ray diffraction pattern of the single crystalline film of Example 1 when the incident X-ray is parallel to the stretching direction of the film. In this case, the film surface is arranged in up and down directions of the figure.

EXAMPLE 2

A film of a copolymer P(VDF-TrFE) of vinylidene fluoride and ethylene trifluoride prepared in a DMF solution is uniaxially stretched about 5.5 times to obtain a stretched copolymer film having a thickness of 50 μm. This film is placed on a Teflon sheet without fixing both ends and heated in an oven at a rate of 4° C./min from 80° C. to 135° C. and held at this temperature for 2 hours to conduct the crystallization. After the cooling, the film is sandwiched between two plates and reheated to 120° C. for removing flexing of the film produced in the above heat treatment. The thus obtained film is a single crystal likewise as obtained in Example 1.

After Al metal is deposited on both surfaces of the film, poling is carried out by repeating polarization reversal at room temperature. The piezoelectricity of the thus poled film is measured by a piezoelectric resonance method to obtain results as shown in Table 1. The value of electromechanical coupling factor $k'_{33}$ for piezoelectric effect for thickness extensional vibration mode is larger than those of the conventionally known piezoelectric polymers. The longitudinal wave acoustic velocity propagating in the direction of molecular chain (stretching direction) is considerably large reflecting the single crystal of the film.

TABLE 1

| Piezoelectricity of single crystalline film of P(VDF-TrFE) (75/25)* (25° C.) | | |
|---|---|---|
| Longitudinal wave acoustic velocity | $V_{11}$ | 2950 m/s |
|  | $V_{22}$ | 1838 m/s |
|  | $V_{33}$ | 2180 m/s |
| Lateral wave acoustic velocity | $V_{44}$ | 1150 m/S |
|  | $V_{55}$ | 1035 m/s |
| Electromechanical coupling factor | $k'_{33}$ | 0.31 |
|  | $k_{31}$ | 0.10 |
|  | $k_{32}$ | 0.18 |
|  | $k_{15}$ | 0.16 |
|  | $k_{24}$ | 0.20 |

*: As co-ordinate axes, there are selected the 1-axis in the stretching direction, the 3-axis in a direction perpendicular to the film surface (polarization direction) and the 2-axis in a direction perpendicular thereto.

As seen from the above, the single crystalline film according to the invention is considerably ideal in the orientation of the molecular chain and in the crystallinity as compared with the film aggregated from lamellar crystals according to the conventional method. Therefore, the poled film according to the invention indicates a larger polarization as compared with that of the conventional film and possesses large piezoelectric constant and electromechanical coupling factor. Furthermore, Young's moduli are large and dynamic loss factors are small, while tensile strength in the stretching direction and bending modulus are large. Moreover, the single crystalline film or fiber according to the invention maintains flexibility even at a lower temperature and is tough, while the lamellar crystal film is brittle at a low temperature (e.g., liquid nitrogen temperature) and is easily broken. And also, the film or fiber according to the invention is optically uniform and excellent in the light permeability.

The single crystal according to the invention is obtained in the form of a film or fiber, so that it can be made at to have various forms in accordance with its use or purpose. Moreover, since the film is apt to break in a direction parallel to the molecular chain, it is effective to prevent such a problem by laminating and adhering plural films without matching the stretching directions of these films with each other.

What is claimed is:

1. A method of producing a ferroelectric polymer single crystalline body, comprising:

stretching a ferroelectric polymer film or fiber consisting of a copolymer selected from the group consisting of a copolymer of ethylene trifluoride and vinylidene fluoride and a copolymer of ethylene tetrafluoride and vinylidene fluoride to provide a stretched film or fiber; and crystallizing the copolymer at a paraelectric phase thereof, in which the crystallization is promoted while maintaining the stretched film or fiber at a substantially free state, wherein said crystallization is carried out by placing the stretched film or fiber on a tack-free material.

2. A ferroelectric polymer single crystalline body which is an optically uniform transparent film or fiber, which consists of a copolymer selected from the group consisting of a copolymer of ethylene trifluoride and vinylidene fluoride and a copolymer of ethylene tetrafluoride and vinylidene fluoride, and which is ferroelectric.

3. The ferroelectric polymer single crystalline body according to claim 2, which is flexible at liquid nitrogen temperature.

4. The ferroelectric polymer single crystalline body according to claim 2, which has a highly developed orientation of molecular chains without being a lamellar crystal.

5. A method of producing a ferroelectric polymer single crystalline body which is an optically uniform transparent film or fiber, the method comprising:

a. stretching a ferroelectric polymer film or fiber consisting of a copolymer selected from the group consisting of a copolymer of ethylene trifluoride and vinylidene fluoride and a copolymer of ethylene tetrafluoride and vinylidene fluoride to provide a stretched film or fiber; and b. crystallizing the stretched film or fiber at a paraelectric phase thereof while maintaining the stretched film or fiber in a substantially free state.

6. The method according to claim 5, wherein crystallizing is carried out under a vacuum or in a gas or a liquid.

7. The method according to claim 5, wherein crystallizing is carried out by placing the stretched film or fiber on a tack-free material.

8. The method according to claim 5, wherein the ferroelectric polymer film or fiber has an orthorhombic phase, an hexagonal phase, and a transition point between the orthorhombic phase and the hexagonal phase, and wherein the method further comprises subjecting the stretched film or fiber to a heat treatment, prior to crystallization of the stretched film or fiber, at a temperature lower than the transition point from the orthorhombic phase to the hexagonal phase.

9. The method according to claim 5, wherein the method produces a ferroelectric polymer single crystalline body which is flexible at liquid nitrogen temperature.

10. The method according to claim 5, wherein the method produces a ferroelectric polymer single crystalline body which has a highly developed orientation of molecular chains without being a lamellar crystal.

11. A method of producing a ferroelectric polymer single crystalline body which is an optically uniform transparent film or fiber, the method comprising:

a. providing a ferroelectric polymer film or fiber consisting of a copolymer selected from the group consisting of a copolymer of ethylene trifluoride and vinylidene fluoride and a copolymer of ethylene tetrafluoride and vinylidene fluoride;

b. stretching at ambient temperature the ferroelectric polymer film or fiber to provide a stretched film or fiber;

c. fixing opposing ends of the stretched film or fiber;

d. heating the stretched and fixed ferroelectric polymer film or fiber from ambient temperature to a temperature corresponding to a paraelectric phase thereof while maintaining the stretched film or fiber in a substantially free state;

e. crystallizing the ferroelectric polymer film or fiber of step (d) by maintaining the temperature corresponding to one of a paraelectric phase thereof or a hexagonal phase thereof for a period of time effective to provide the ferroelectric polymer single crystalline body; and d. slowly cooling the crystallized ferroelectric polymer film or fiber to ambient temperature.

12. A method of producing a ferroelectric polymer single crystalline body which is an optically uniform transparent film or fiber, the method comprising:

a. providing a ferroelectric polymer film or fiber consisting of a copolymer selected from the group consisting of a copolymer of ethylene trifluoride and vinylidene fluoride and a copolymer of ethylene tetrafluoride and vinylidene fluoride;

b. stretching at ambient temperature the ferroelectric polymer film or fiber to provide a stretched film or fiber;

c. placing the stretched film or fiber on a sheet of tack-free material;

d. heating the stretched ferroelectric polymer film or fiber from ambient temperature to a temperature corresponding to a paraelectric phase thereof while maintaining the stretched film or fiber in a substantially free state;

e. crystallizing the ferroelectric polymer film or fiber of step (d) by maintaining the temperature corresponding to one of a paraelectric phase thereof or a hexagonal phase thereof for a period of time effective to crystallize the ferroelectric polymer into a single crystalline body; and d. slowly cooling the crystallized ferroelectric polymer film or fiber to ambient temperature.

13. The method according to claim 12, further comprising:

f. sandwiching the crystallized ferroelectric polymer film or fiber between two plates to provide an assembly;

g. reheating the assembly to a temperature below the Curie point for removing flexing of the fiber or film during step (d);

h. depositing metal electrodes on the respective surfaces of the film or fiber of step (g); and i. poling the film or fiber of step (h) at ambient temperature by repeated polarization reversal.

14. A process of producing an element selected from the group consisting of a piezoelectric element, a pyroelectric element, and a nonlinear optical element, comprising:

providing a ferroelectric polymer single crystalline body which is an optically uniform transparent film or fiber, and which consists of a copolymer selected from the group consisting of a copolymer of ethylene trifluoride and vinylidene fluoride and a copolymer of ethylene tetrafluoride and vinylidene fluoride, which is ferroelectric, and which has been subjected to a poling; and constructing the element selected from the group consisting of a piezoelectric element, a pyroelectric element, and a nonlinear optical element from the ferroelectric polymer single crystalline body.

15. The process according to claim 14, wherein the ferroelectric polymer single crystalline body provided is flexible at liquid nitrogen temperature.

16. The process according to claim 14, wherein the ferroelectric polymer single crystalline body provided has a highly developed orientation of molecular chains without being a lamellar crystal.

* * * * *